US008848162B2

(12) United States Patent
Mulkens

(10) Patent No.: US 8,848,162 B2
(45) Date of Patent: Sep. 30, 2014

(54) LITHOGRAPHIC APPARATUS AND DEVICE MANUFACTURING METHOD

(75) Inventor: Johannes Catharinus Hubertus Mulkens, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 979 days.

(21) Appl. No.: 12/901,163

(22) Filed: Oct. 8, 2010

(65) Prior Publication Data

US 2011/0025993 A1  Feb. 3, 2011

Related U.S. Application Data

(63) Continuation of application No. 11/516,734, filed on Sep. 7, 2006, now Pat. No. 7,826,030.

(51) Int. Cl.
G03F 7/20 (2006.01)
(52) U.S. Cl.
CPC ........ *G03F 7/70925* (2013.01); *G03F 7/70858* (2013.01); *G03F 7/70916* (2013.01); *G03F 7/70341* (2013.01)
USPC .................. 355/30; 355/53; 355/72; 355/77
(58) Field of Classification Search
USPC ........... 355/30, 52, 53, 55, 67–71, 72, 73, 77; 359/665–667; 250/492.1, 492.2, 250/492.22, 548; 430/5, 8, 22, 30, 311, 430/312, 321
See application file for complete search history.

(56) References Cited

U.S. PATENT DOCUMENTS

| 4,346,164 | A | 8/1982 | Tabarelli et al. ............. 430/311 |
| 4,509,852 | A | 4/1985 | Tabarelli et al. ............. 355/30 |
| 5,610,683 | A | 3/1997 | Takahashi ................. 355/53 |
| 7,414,794 | B2 | 8/2008 | Novak ..................... 359/649 |
| 7,733,459 | B2 | 6/2010 | Dierichs et al. |
| 2004/0105080 | A1 | 6/2004 | Teunissen et al. ............. 355/30 |
| 2004/0114117 | A1 | 6/2004 | Bleeker .................... 355/53 |
| 2004/0136494 | A1 | 7/2004 | Lof et al. ................... 378/34 |
| 2004/0207824 | A1 | 10/2004 | Lof et al. ................... 355/30 |
| 2005/0074704 | A1* | 4/2005 | Endo et al. ................. 430/322 |
| 2005/0078286 | A1* | 4/2005 | Dierichs et al. ............. 355/30 |
| 2005/0094125 | A1 | 5/2005 | Arai ....................... 355/72 |
| 2005/0146695 | A1* | 7/2005 | Kawakami ................. 355/30 |
| 2005/0179877 | A1* | 8/2005 | Mulkens et al. ............. 355/30 |

(Continued)

FOREIGN PATENT DOCUMENTS

| EP | 1 420 298 A2 | 5/2004 |
| EP | 1 420 300 A2 | 5/2004 |

(Continued)

OTHER PUBLICATIONS

English translation of WO2005/122218, published on Dec. 2005.*

(Continued)

*Primary Examiner* — Toan Ton
*Assistant Examiner* — Christina Riddle
(74) *Attorney, Agent, or Firm* — Pillsbury Winthrop Shaw Pittman LLP

(57) ABSTRACT

A system to recycle immersion fluid in an immersion fluid lithographic apparatus is described. A recycling path comprising a plurality of parallel paths, each of which has its own parallel liquid treatment unit optimized to treat fluid which is directed through it, is disclosed.

7 Claims, 6 Drawing Sheets

(56) References Cited

U.S. PATENT DOCUMENTS

| | | | |
|---|---|---|---|
| 2005/0200815 A1 | 9/2005 | Akamatsu | 355/53 |
| 2005/0243293 A1* | 11/2005 | Hara et al. | 355/53 |
| 2006/0023182 A1 | 2/2006 | Novak et al. | 355/53 |
| 2006/0038968 A1 | 2/2006 | Kemper et al. | 355/18 |
| 2006/0072088 A1* | 4/2006 | Lipson et al. | 355/53 |
| 2006/0077367 A1 | 4/2006 | Kobayashi et al. | 355/53 |
| 2006/0119815 A1 | 6/2006 | Franken et al. | 355/53 |
| 2006/0139594 A1 | 6/2006 | Hara et al. | 355/53 |
| 2006/0139614 A1 | 6/2006 | Owa et al. | 355/72 |
| 2006/0158627 A1 | 7/2006 | Kemper et al. | 355/53 |
| 2006/0232757 A1 | 10/2006 | Tani et al. | 355/53 |
| 2006/0274293 A1 | 12/2006 | Nagasaka et al. | 355/53 |
| 2007/0188725 A1* | 8/2007 | Sakai | 355/53 |
| 2007/0242247 A1* | 10/2007 | Shiraishi | 355/53 |
| 2007/0252960 A1 | 11/2007 | Kida | 355/30 |
| 2007/0291239 A1 | 12/2007 | Shiraishi | 355/30 |
| 2008/0129970 A1 | 6/2008 | Furukawa et al. | 355/30 |
| 2009/0273768 A1* | 11/2009 | Kagayama et al. | 355/77 |

FOREIGN PATENT DOCUMENTS

| | | | |
|---|---|---|---|
| EP | 1 420 300 A3 | 8/2005 | |
| EP | 1 420 298 A3 | 10/2005 | |
| JP | 10-128332 | 5/1998 | |
| JP | 2005-079584 | 3/2005 | |
| JP | 2006190971 A | 7/2006 | |
| JP | 2006190997 A | 7/2006 | |
| JP | 2006237291 A | 9/2006 | |
| WO | WO 99/49504 | 9/1999 | |
| WO | WO2004095135 A2 | 11/2004 | |
| WO | 2005/081294 | 9/2005 | |
| WO | WO2005122218 A1 | 12/2005 | |
| WO | WO 2005122218 A1 * | 12/2005 | H01L 21/027 |
| WO | 2006059720 A1 | 6/2006 | |
| WO | WO2006062188 A1 | 6/2006 | |
| WO | WO2006080250 A1 | 8/2006 | |

OTHER PUBLICATIONS

Japanese Office Action in related application 2007-227393 mailed Aug. 3, 2010.

* cited by examiner

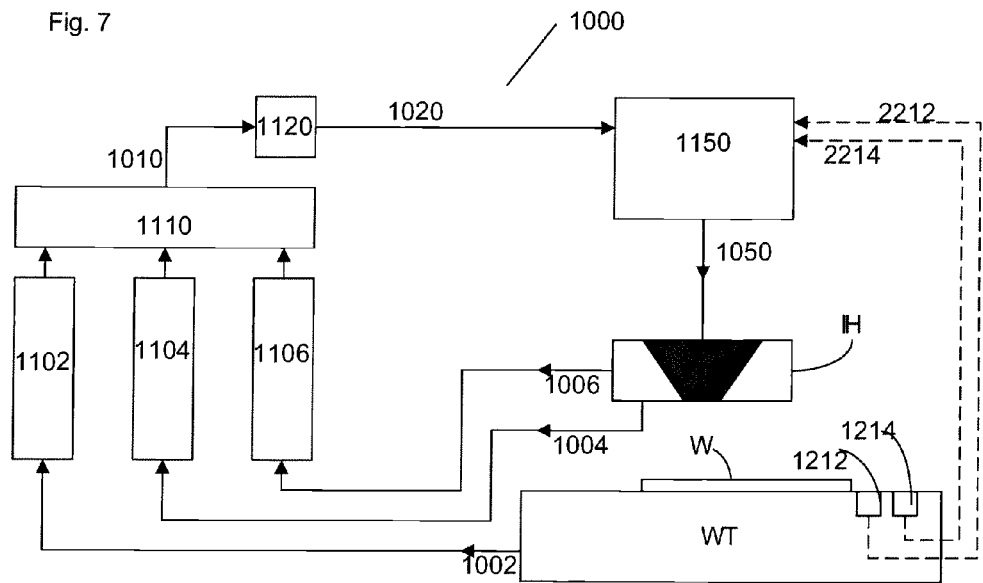
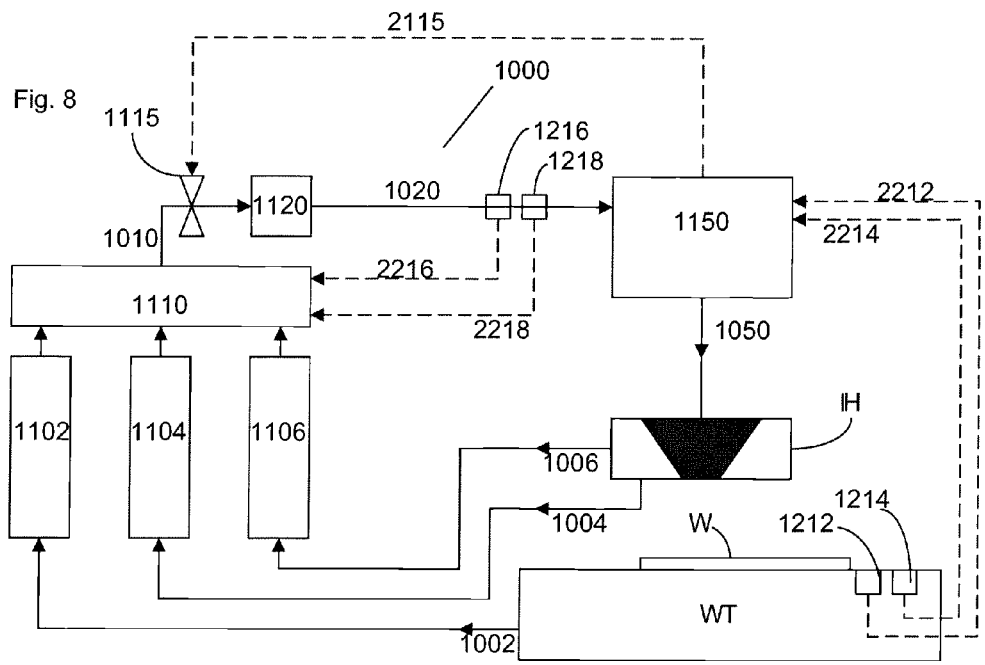

LITHOGRAPHIC APPARATUS AND DEVICE MANUFACTURING METHOD

The present application is a continuation of U.S. patent application Ser. No. 11/516,734 filed on Sep. 7, 2006, now allowed, from which benefit is claimed under 35 U.S.C. §120. The entire contents of this application is herein fully incorporated by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion lithography solution with a localized liquid supply system solution which has been proposed is to provide the liquid supply system with a barrier member which extends along at least a part of a boundary of the space between the final element of the projection system and the substrate table. Such a solution is illustrated in FIG. 5. The barrier member is substantially stationary relative to the projection system in the XY plane though there may be some relative movement in the Z direction (in the direction of the optical axis). In an embodiment, a seal is formed between the barrier member and the surface of the substrate and may be a contactless seal such as a gas seal.

The barrier member 12 at least partly contains liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the barrier member 12 positioned below and surrounding the final element of the projection system PL. Liquid is brought into the space below the projection system and within the barrier member 12 by liquid inlet 13 and may be removed by liquid outlet 13. The barrier member 12 may extend a little above the final element of the projection system and the liquid level rises above the final element so that a buffer of liquid is provided. The barrier member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas, provided under pressure via inlet 15 to the gap between barrier member 12 and substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas 16 is effective to contain the liquid in the space 11. Such a system is disclosed in United States patent application publication no. 2004-0207824, hereby incorporated in its entirety by reference.

In European patent application publication no. EP 1420300 and United States patent application publication no. 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Early immersion lithographic machines have used water as the liquid between the projection system and the substrate. Water has a refractive index of about 1.4 and is relatively inexpensive. The next generation of lithographic immersion apparatus will use a liquid with a refractive index higher than that of water. Unfortunately the candidate liquids are not as abundant as water and are therefore more expensive. Furthermore they tend to be harmful to the environment.

SUMMARY

It is desirable, for example, to provide a lithographic apparatus in which steps are taken to overcome the otherwise prohibitive cost and/or environmental difficulty of using a high refractive index fluid.

According to an aspect of the invention, there is provided a lithographic apparatus comprising:
  a projection system configured to project a patterned radiation beam onto a target portion of a substrate;
  a liquid supply system configured to provide a liquid to a space between the projection system and a substrate; and
  a recycling system configured to collect liquid leaving the liquid supply system and to re-provide the liquid to the liquid supply system, the recycling system comprising two parallel liquid treatment units configured to treat the liquid, the parallel liquid treatment units arranged to treat different liquid such that there are two recycling paths for liquid from the liquid supply system through the recycling system back to the liquid supply system.

According to an aspect of the invention, there is provided an immersion lithographic apparatus configured to project a patterned beam of radiation through a liquid onto a substrate, the apparatus comprising a liquid circuit around which the liquid is configured to flow, the liquid circuit comprising some parts common to all liquid flow and some parts comprising separate parallel liquid flow paths, wherein at least some of the separate parallel liquid flow paths have a liquid treatment unit through which liquid in a respective path must pass and wherein the liquid treatment units of different paths are configured to treat liquid passing through them differently.

According to an aspect of the invention, there is provided a device manufacturing method comprising:
  using a projection system to project a patterned beam of radiation onto a substrate through liquid provided to a space between the projection system and the substrate;
  removing liquid from the space and treating it in one of several ways in accordance with how it was removed from the space, in accordance with whether or not the patterned beam of radiation had passed through it, or both; and
  re-providing at least some of the treated liquid to the space.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7 illustrates schematically a first embodiment of the present invention;

FIG. 8 illustrates schematically a second embodiment of the present invention;

DETAILED DESCRIPTION

Figure 1:
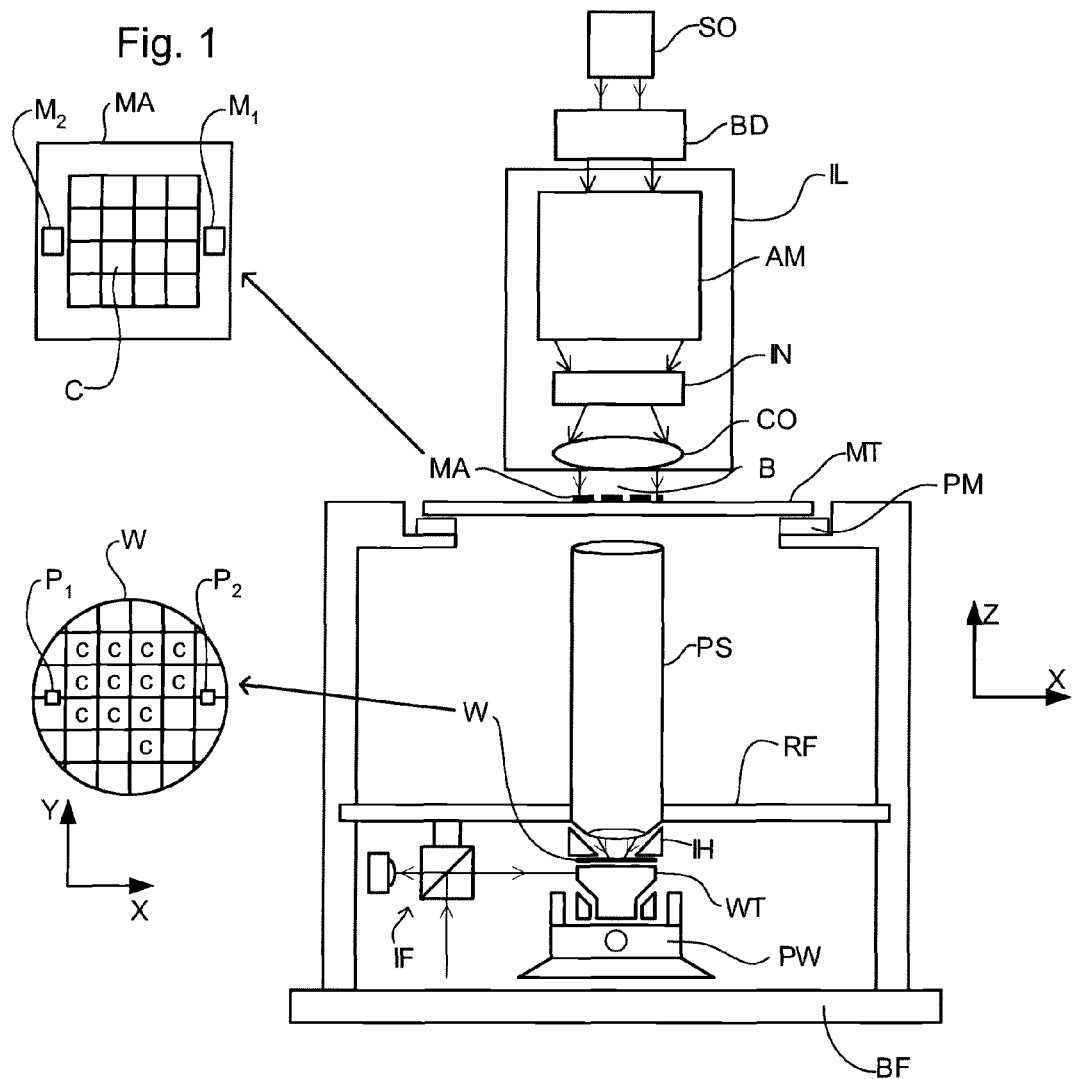
FIG. 1 depicts a lithographic apparatus according to an embodiment of the invention.
Figure 2:
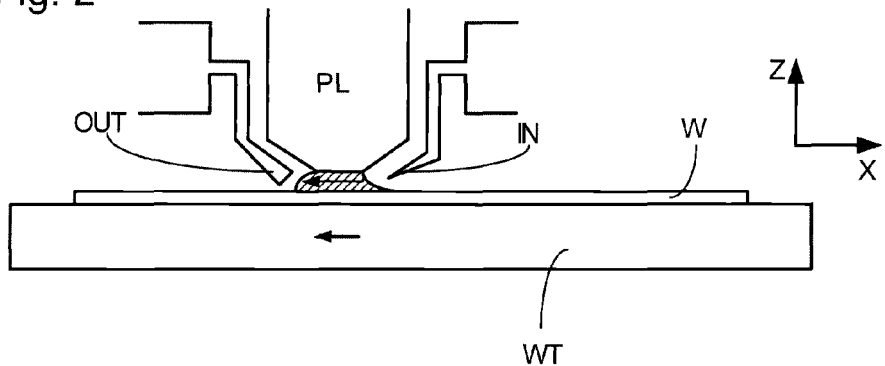
FIGS. 2 and 3 depict a liquid supply system for use in a lithographic projection apparatus.
Figure 3:
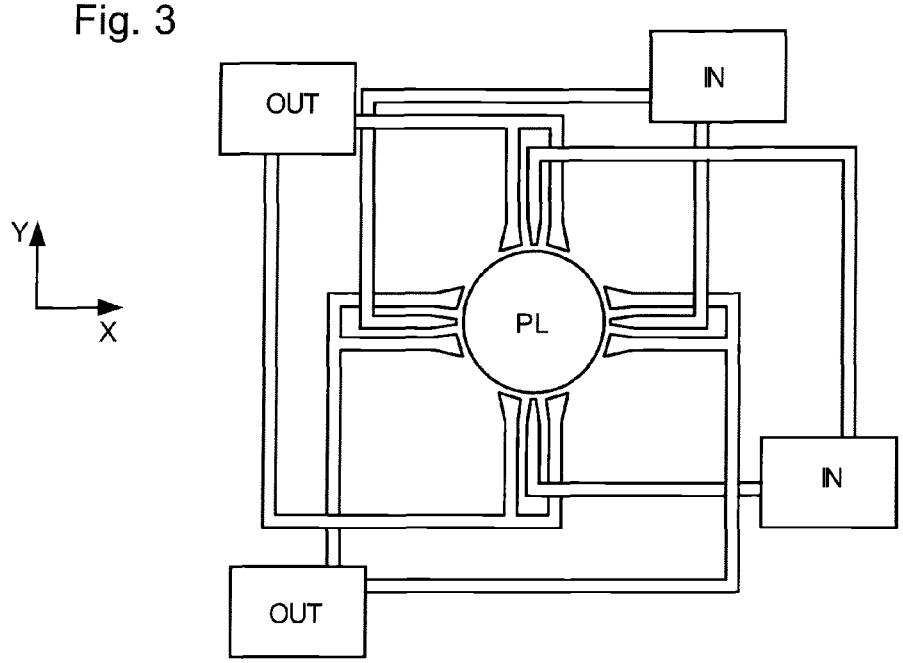
Figure 4:
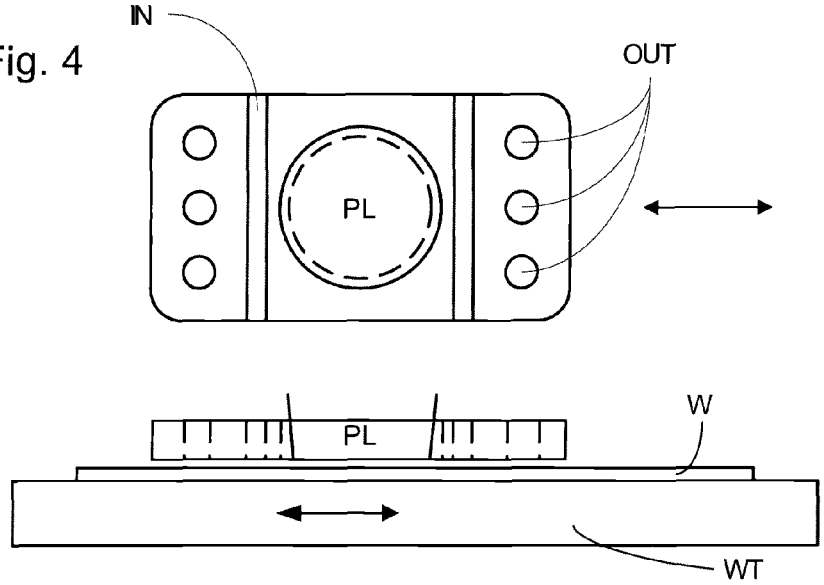
FIG. 4 depicts a liquid supply system for use in a lithographic projection apparatus.
Figure 5:
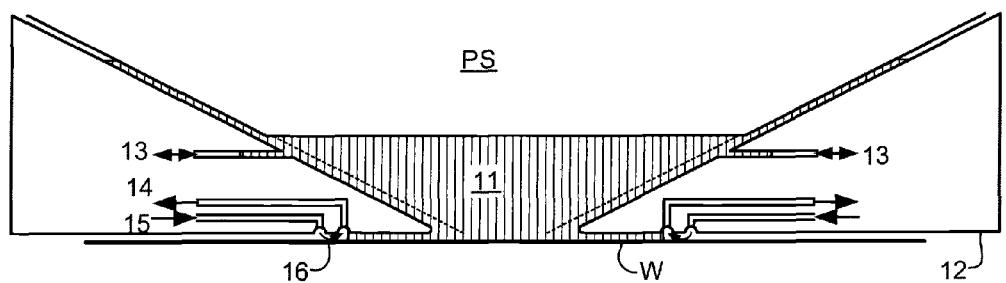
FIG. 5 depicts, in cross-section, another liquid supply system for use in a lithographic projection apparatus.

FIG. 1 schematically depicts a lithographic apparatus according to one embodiment of the invention. The apparatus comprises:
  an illumination system (illuminator) IL configured to condition a radiation beam B (e.g. UV radiation or DUV radiation);
  a support structure (e.g. a mask table) MT constructed to support a patterning device (e.g. a mask) MA and connected to a first positioner PM configured to accurately position the patterning device in accordance with certain parameters;
  a substrate table (e.g. a wafer table) WT constructed to hold a substrate (e.g. a resist-coated wafer) W and connected to a second positioner PW configured to accurately position the substrate in accordance with certain parameters; and
  a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although one or more embodiments will be described relating to an immersion liquid other than water, one or more embodiments of the present invention is equally applicable to water. One or more embodiments of the present invention are particularly suited to an immersion liquid other than water such as one or more of the next generation higher refractive index liquids. These fluids are most likely to be hydrocarbon fluids such as Decaline. Candidate fluids include IF131 and IF132 produced by Dupont, HIL-1 and HIL-2 produced by JSR or Delphi produced by Mitsui. Other candidates are mixtures of fluids with nano-particles suspended in them or acids such as phosphoric acids. Because of their high cost, the recycling of high refractive index liquids in an immersion lithographic apparatus is likely to be more attractive than the recycling of water.

As will be described with reference to FIG. 6, it will become clear that, in an immersion lithographic apparatus, immersion liquid which is removed from a space between the projection system PS and the substrate (where it is at least partly contained by a liquid supply system IH) can be removed through several different paths. Depending upon the path through which the immersion liquid is removed from the space, it is advantageous to treat that immersion liquid before recycling it back into the space on an individual basis according to the path it has followed. This is because the path it has followed determines the likely contaminants within it so that liquid purification can be customized to those particular contaminants, for example. As well as immersion liquid being extracted through the liquid supply system (often in the form of a barrier member 12), immersion liquid may also or alternatively be removed through the substrate table WT, in particular by removal of liquid which seeps into a gap between the edge of a substrate W and the substrate table WT.

Figure 6:
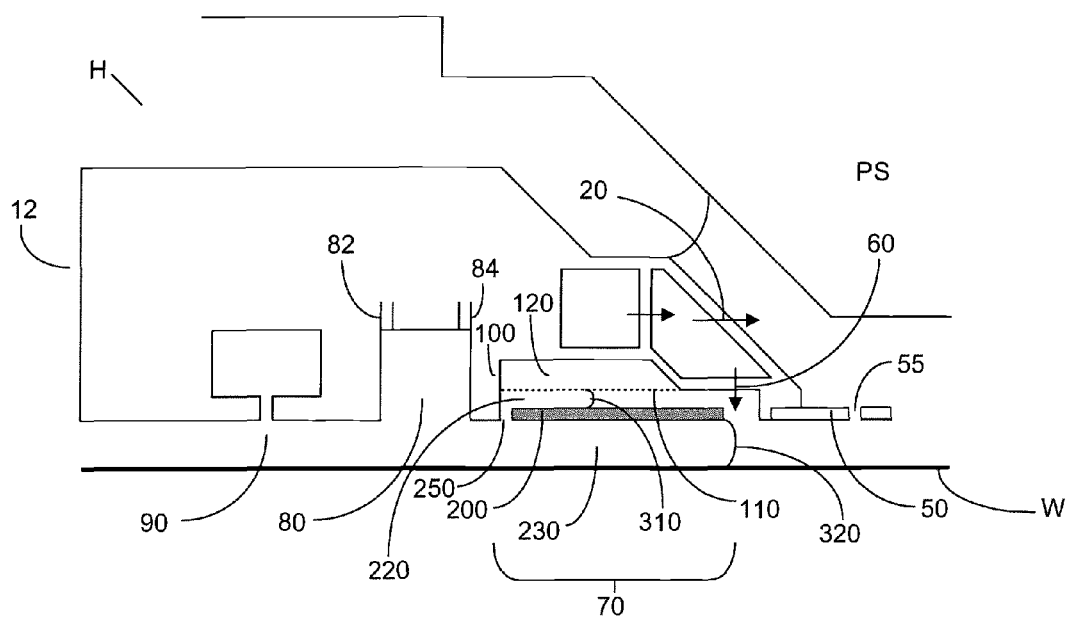
FIG. 6 depicts, in cross-section, a further type of liquid supply system for use in a lithographic projection apparatus.

FIG. 6 illustrates a barrier member 12 which is part of a liquid supply system IH. The barrier member 12 extends around the periphery of the final element of the projection system PS such that the barrier member (which is sometimes called a seal member) is, for example, substantially annular in overall shape.

The function of the barrier member 12 is to at least partly maintain or confine liquid in the space between the projection system PS and the substrate W so that the projection beam may pass through the liquid. The top level of liquid is simply contained by the presence of the barrier member 12 and the level of liquid in the space is maintained such that the liquid does not overflow over the top of the barrier member 12. A seal is provided between the bottom of the barrier member 12 and the substrate W. In FIG. 6 the seal is a contactless seal and is made up of several components. Working radially outwardly from the optical axis of the projection system PS, there is provided a (optional) flow plate 50 which extends into the space (though not into the path of the projection beam) which helps maintain parallel flow of the immersion liquid out of inlet 20 across the space and then out through an outlet (not illustrated) opposite and at the same level as the inlet (so that the immersion liquid flows across the space between the final element of the projection system and the substrate). The flow control plate has one or more through holes 55 in it to reduce the resistance to movement in the direction of the optical axis of the barrier member 12 relative to the projection system PS and/or substrate W. Moving radially outwardly along the bottom of the barrier member 12 there is then provided an inlet 60 which provides a flow of liquid in a direction substantially parallel to the optical axis towards the substrate. This flow of liquid is used to help fill any gaps between the edge of the substrate W and the substrate table WT which supports the substrate. If this gap is not filled with liquid, bubbles may be more likely to be included in the liquid in the space between the projection system PS and the substrate W when an edge of the substrate W passes under the barrier member 12. This is undesirable as it can lead to deterioration of the image quality.

Radially outwardly of the inlet 60 is a extractor assembly 70 configured to extract liquid from between the barrier member 12 and the substrate W. The extractor 70 will be described in more detail below and forms part of the contactless seal which is created between the barrier member 12 and the substrate W.

Radially outwardly of the extractor assembly is a recess 80 which is connected through an outlet 82 to the atmosphere and via an inlet 84 to a low pressure source. Radially outwardly the recess 80 is a gas knife 90. An arrangement of the extractor, recess and gas knife is disclosed in detail in United States patent application publication no. US 2006-0158627, incorporated herein its entirety by reference. However, in that document the arrangement of the extractor assembly is different.

The extractor assembly 70 comprises a liquid removal device or extractor or outlet 100 such as the one disclosed in United States patent application publication no. 2006-0038968, incorporated herein its entirety by reference. Any type of liquid extractor can be used. In an embodiment, the liquid removal device 100 comprises an outlet which is covered in a porous material 110 which is used to separate liquid from gas to enable single-liquid phase liquid extraction. A chamber 120 downstream of the porous material 110 is maintained at a slight under pressure and is filled with liquid. The under pressure in the chamber 120 is such that the meniscuses formed in the holes of the porous material prevent ambient gas (e.g., air) being drawn into the chamber 120 of the liquid removal device 100. However, when the porous material 110 comes into contact with liquid there is no meniscus to restrict flow and the liquid can flow freely into the chamber 120 of the liquid removal device 100. The porous material 110 extends radially inwardly along the barrier member 12 (as well as around the space) and its rate of extraction varies according to how much of the porous material 110 is covered by liquid.

A plate 200 is provided between the liquid removal device 100 and the substrate W so that the function of liquid extraction and the function of meniscus control can be separated from one another and the barrier member 12 can be optimized for each.

The plate 200 is a divider or any other element which has the function of splitting the space between the liquid removal device 100 and the substrate W into two channels, an upper channel 220 and a lower channel 230 wherein the upper channel 220 is between the upper surface of the plate 200 and the liquid removal device 100 and the lower channel 230 is between the lower surface of the plate 200 and the substrate W. Each channel is open, at its radially innermost end, to the space.

An under pressure can be applied in the upper channel 220, rather than leaving it open to the atmosphere through one or more breathing holes 250, e.g., one or more through holes 250. In this way the upper channel 220 can be made wider.

Thus, with the plate 200, there are two meniscuses 310, 320. A first meniscus 310 is positioned above the plate 200 and extends between the porous material 110 and the top surface of the plate 200 and a second meniscus 320 which is positioned underneath the plate 200 and which extends between the plate 200 and the substrate W. In this way, for example, the extractor assembly 70 can be configured for control of the first meniscus for optimum extraction of liquid and for positional control of the second meniscus 320 such that the viscous drag length for the second meniscus 320 is reduced. For example, the characteristics, in particular of the plate 200, may be optimized to make it energetically favorable for the meniscus 320 to remain adhered to the plate 200 such that the scan speed of the substrate W beneath the barrier member 10 can be increased. Capillary forces acting on the second meniscus 320 are outwards and are balanced by an under pressure in the liquid adjacent the meniscus so that the meniscus stays still. Higher loading on the meniscus, for example by viscous drag and inertia, results in a lowering of the contact angle of the meniscus with the surface.

As noted above, one or more breathing holes 250 may be provided at the radially outward most end of the plate 200 such that the first meniscus 310 is free to move inwardly and outwardly beneath the porous material 110 so that the extraction rate of the liquid removal device 100 can vary according to how much of the porous material 110 is covered by liquid. As illustrated in FIG. 6 the second meniscus 320 is adhered to a lower innermost edge of the plate 200. In FIG. 6, the innermost lower edge of the plate 200 is provided with a sharp edge so as to pin the second meniscus 320 in place.

Although not specifically illustrated in FIG. 6, the liquid supply system has a means for dealing with variations in the level of the liquid. This is so that liquid which builds up between the projection system PS and the barrier member 12 can be dealt with and does not spill. Such a build-up of liquid might occur during relative movement of the barrier member 12 to a projection system PS described below. One way of dealing with this liquid is to provide the barrier member 12 so that it is very large so that there is hardly any pressure gradient over the periphery of the barrier member 12 during movement of the barrier member 12 relative to the projection system PS. In an alternative or additional arrangement, liquid may be removed from the top of the barrier member 12 using, for example, an extractor such as a single phase extractor similar to the extractor 110.

Thus, it can be seen that there are several ways in which immersion liquid is removed from the space between the final element of the projection system and the substrate. These include immersion liquid which flows across the space out of inlet 20 and into an outlet opposite the inlet 20 (the outlet is not illustrated). This immersion liquid may or may not be irradiated depending upon when the projection beam PB is activated Immersion liquid is removed by the extractor 70 and this immersion liquid is likely to be extracted as a single phase. Other immersion liquid which escapes the extractor 70 could be collected by the recess 80 and gas (or fluid-inert gas) knife 90 combination. Any such immersion liquid extracted is likely to be a combination of liquid and gas. Finally, liquid is also likely to be removed from the space through the substrate table WS from between the edge of the substrate W and the substrate table WS. This is also likely to have a high amount of gas. Liquid which has been in contact with a top surface of the substrate (i.e. the resist) may also be contaminated by leaching so that liquid may be best treated in a particular way different to other liquid, as described below.

An embodiment of the present invention is directed to treating at least two of the sources of immersion liquid separately in a recycling path or circuit. Different sources have different levels of contamination and the more contamination, the more difficult and expensive recycling becomes.

One or more embodiments of the invention is applicable to any type of liquid supply system IH. In the below embodiments, the liquid supply system is assumed to have three main types of liquid removed. These are single phase immersion liquid which has been in contact with the liquid supply system and which may or may not have been irradiated; two phase immersion liquid which has been in contact with the liquid supply system (i.e. immersion liquid extracted by a gas knife extractor); and immersion liquid which has been in contact with the substrate table WS and is likely to be two phase. In the Figures these flows are labeled 1006, 1004 and 1002 respectively.

One or more aspects or features of one or more embodiments or examples of the present invention may be used or combined with one or more other embodiments or examples of the present invention.

Embodiment 1

A first embodiment will be described with reference to FIG. 7. In FIG. 7 the liquid supply system IH is illustrated schematically as is the substrate table WT on which the substrate W is supported. The solid arrows show the various flow paths of immersion liquid in the liquid circuit 1000. As can be seen, liquid is prepared in a liquid preparation module 1150 and supplied through line 1050 to the liquid supply system IH. The liquid supply system IH fills the space between the projection system PB and the substrate W with the liquid.

In this and other embodiments, three types of immersion liquid are shown as being removed from that space though there may be less or more than three. The three types of liquid are the liquid 1002 which is extracted from the space through the substrate table WT, the liquid 1004 which is extracted from the space through, e.g., a gas knife extractor and the liquid 1006 which is extracted through, e.g., an outlet in the side of the barrier member 12. Each of these types of liquid has its own parallel liquid treatment units 1102, 1104, 1106 in the recycling system. The parallel liquid treatment units 1102, 1104, 1106 are optimized to treat the respective flow of immersion liquid for the types of contaminants likely to be present.

Thus, the parallel liquid treatment unit 1102, which treats the immersion liquid from the substrate table WT, has a degassing unit to degas the immersion liquid which passes through it, and has a purifier to for purify the immersion liquid. The purifier will be optimized to purify immersion liquid which has come into contact with the substrate table WT. The parallel liquid treatment unit 1102 also has one or more particle filters which are optimized to extract particles likely to have contaminated the immersion liquid in the substrate table WT. In the parallel liquid treatment units, the particle filter(s) is for fairly coarse particles.

Equally the parallel liquid treatment unit 1104 for the liquid 1004, which exits through, for example, the gas knife extractor of the liquid supply system, has a degassing unit, a purifier and one or more particle filters. The purifier and one or more particle filters of the parallel liquid treatment unit 1104 will be optimized for immersion liquid which has been in contact with the liquid supply system IH (e.g., barrier member 12). The unit 1104 will be optimized to remove particles and purify immersion liquid which has been acted on by, for example, a gas knife which may result in its own particular type of impurities and particles.

As will be appreciated, the liquid 1002 may also have been in contact with the liquid supply system IH and the liquid 1004 may have been in contact with the top surface of the substrate table WT.

Finally, the liquid 1006, which has simply passed across the space and is therefore likely to be removed from the space as a single phase, will be treated by the liquid treatment unit 1106 which may not comprise a degassing unit (because there will likely be no gas in the liquid because there would have been no opportunity for gas to be introduced into that liquid) but will comprise a purifier and one or more particle filters optimized to remove particles which are likely to exist in the liquid supply system.

The three flows are illustrative only. There may be other flows, for example a single phase flow extracted through an extractor between the liquid supply system IH and the substrate W, such as extractor 70.

The flows of liquid out of the parallel liquid treatment units 1102, 1104, 1106 are combined by a fluid cycling integrator 1110 and supplied further as flow 1010 to a container or buffer 1120 where the liquid is stored until it is used by the fluid preparation unit 1150. The fluid preparation unit 1150 may itself comprise several units to treat the liquid prior to it being supplied to the liquid supply system IH. The fluid preparation unit 1150 can be seen as a serial liquid treatment unit in that all of the recycled immersion liquid will pass through it from the container 1120 via flow 1020. The fluid preparation unit 1150 could contain a degassing unit, a temperature control unit, a flow control unit and a refractive index control unit. In the embodiment illustrated in FIG. 7, the fluid preparation unit 1150 has a fine particle filter unit for final filtration after the one or more coarse filters of the parallel liquid treatment units 1102, 1104, 1106. Of course any of these parts of the fluid preparation unit 1150 could be positioned separately in the flow paths 1010 or 1020.

Elements of the fluid preparation unit 1150 can be controlled in a feed-back manner based on measurements taken at the substrate table WT using sensors 1212 and 1214. Sensor 1212 could, for example, be a wavefront sensor and sensor 1214 could be an intensity (absorption) sensor. Based on the measurement results of these sensors, the fluid preparation unit 1150 and the rest of the lithographic apparatus could be controlled to achieve the correct wavefront position and dose. This is achieved through control signals 2212 and 2214. The final preparation unit 1150 could vary how the immersion fluid is prepared prior to entering the liquid supplied system IH and thereby control the refractive index (e.g. by temperature variation). One or both of those sensors could also be used in determining when it is necessary to renew the immersion liquid in the circuit 1000. Obviously it is desirable to ensure that the absorption remains below a pre-determined maximum acceptable level and that the refractive index remains stable and if not that the refractive index is known so that the necessary optical corrections can be made. Alternatively or additionally, there could be a regular program in place for the periodical replacement of liquid in the circuit 1000.

Parts of the circuit 1000 could be supplied with the main bulk of the immersion lithographic apparatus and other parts, in particular the parallel treatment units, could be provided as a separate unit from the bulk of the immersion lithographic apparatus.

The apparatus of this and other embodiments may be part of a closed system or a partially closed system. This is in contrast to an open system in which immersion liquid which is removed from the lithographic apparatus is either disposed or is re-worked offline and later re-supplied to the lithographic apparatus. In a closed system the liquid in the apparatus is continually recycled and the liquid is not replenished in use with fresh liquid. It may be necessary to include two paths through which the fluid may be recycled in a closed system (as well as in a partially closed system) in case for some reason a part of the recycling system becomes inoperative. Thus, effectively there would be one or more valves to divert the liquid from, for example, one or more of the liquid treatment units 1102, 1104, 1106, fluid cycling integrator 1110, container 1120 and fluid preparation unit 1150 to a separate circuit comprising the same components. The valve(s) may be part of one or more of those devices or in the flow path before or after one or more of those devices as appropriate. In a partially closed system, fresh liquid can be added (for example to the container 1120 during operation of the recycling system). Liquid exiting the liquid supply IH or substrate table WT could be diverted to be disposed of or to be re-worked offline prior to being re-supplied to the container 1120. Using this system new immersion liquid can be added into the circuit 1000 without interruption of the flow of immersion liquid so that new immersion liquid can be added without any downtime of the whole apparatus.

Embodiment 2

A second embodiment is illustrated in FIG. 8 and is the same as the first embodiment except as is described below.

In the second embodiment, the apparatus has a further control signal 2115 from the fluid preparation unit 1150 to a pressure control unit 1115. This ensures that the fluid preparation unit 1150 receives immersion liquid at the correct rate. This arrangement is particularly useful if the fluid recycling integrator 1110 and the parallel treatment units 1102, 1104, 1106 are part of a separate machine to the remainder of the circuit 1000.

Furthermore, two sensors 1216, 1218 are provided in the path 1020 from the container 1120 to the fluid preparation unit 1150. These sensors measure the refractive index of the immersion liquid directly and/or the absorption of the immersion liquid.

The outputs of the sensors 2216, 2218 are provided to the fluid recycling integrator (and/or one or more of the parallel treatment units 1102, 1104, 1106) so that any necessary adjustment can be made directly to reach the desired refractive index and/or absorption of the immersion liquid entering the fluid preparation unit 1150. This extra control prior to entry of the immersion liquid into the fluid preparation unit 1150 may result in increased control of the properties of the immersion liquid entering the liquid supply system IH.

Embodiment 3

Figure 9:
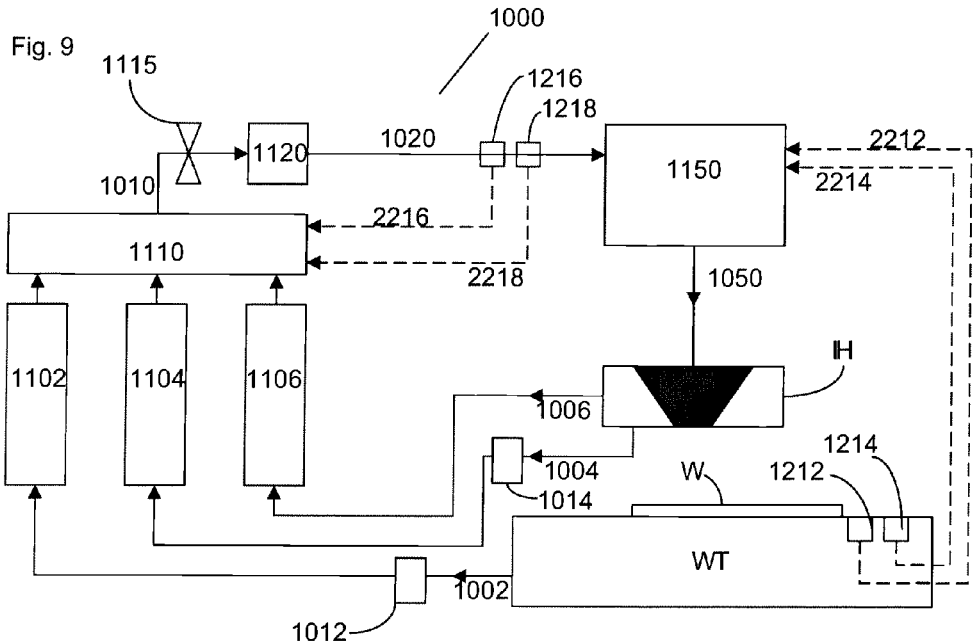
FIG. 9 illustrates schematically a third embodiment of the present invention.

A third embodiment is illustrated in FIG. 9 and is the same as the first or second embodiment except as is described below.

In order to ease splitting of the parallel treatment units 1102, 1104, 1106 from the remainder of the lithographic apparatus, in the third embodiment the parallel treatment units 1102, 1104, used to treat immersion liquid which may have had gas incorporated in it, do not have degassing units. Instead, separate degassing units 1014, 1012 are provided in the immersion liquid paths 1002, 1004 prior to those immersion liquid paths reaching their respective parallel treatment units 1102, 1104. In this way the degassing units, which can be quite complicated, can be formed as part of the lithographic apparatus thereby easing the splitting up of the unit into two parts.

Embodiment 4

Figure 10:
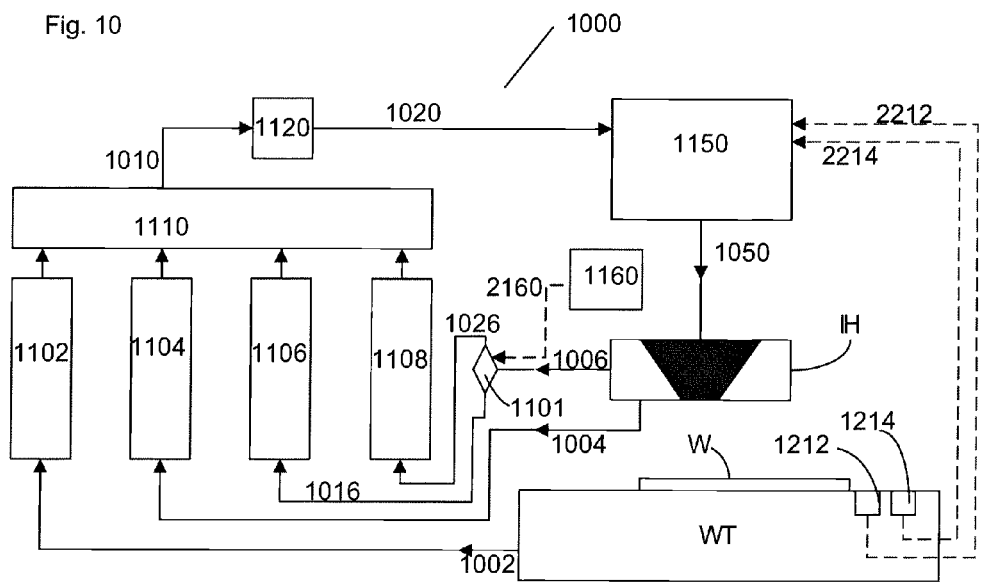
FIG. 10 illustrates schematically a fourth embodiment of the present invention.

A fourth embodiment is illustrated in FIG. 10. The fourth embodiment is the same as the first embodiment except as described below.

In the fourth embodiment, a fourth parallel treatment unit 1108 is provided. The flow path 1006 which contains single phase immersion liquid which has passed across the space is either directed through a path 1016 to parallel treatment unit 1106 or alternatively directed through path 1026 to parallel treatment unit 1108. The destination of immersion liquid in flow path 1006 is chosen by a valve 1101 which is controlled by a signal 2160 from a dose control system 1160 which performs a calculation to establish whether immersion liquid in path 1006 upstream of the valve 1101 has been irradiated or not. If the immersion liquid has been irradiated, the valve is switched so that the immersion liquid passes through path 1026 to parallel treatment unit 1108 and such that if the immersion liquid upstream of the valve 1101 has not been irradiated that it passes through path 1016 to parallel treatment unit 1106. In this way, parallel treatment units 1106 and 1108 can be optimized for the treatment, on the one hand, of immersion liquid which has not been irradiated (which may need very little, if any, treatment) and on the other hand for treatment of immersion liquid which has been irradiated.

Embodiment 5

Figure 11:
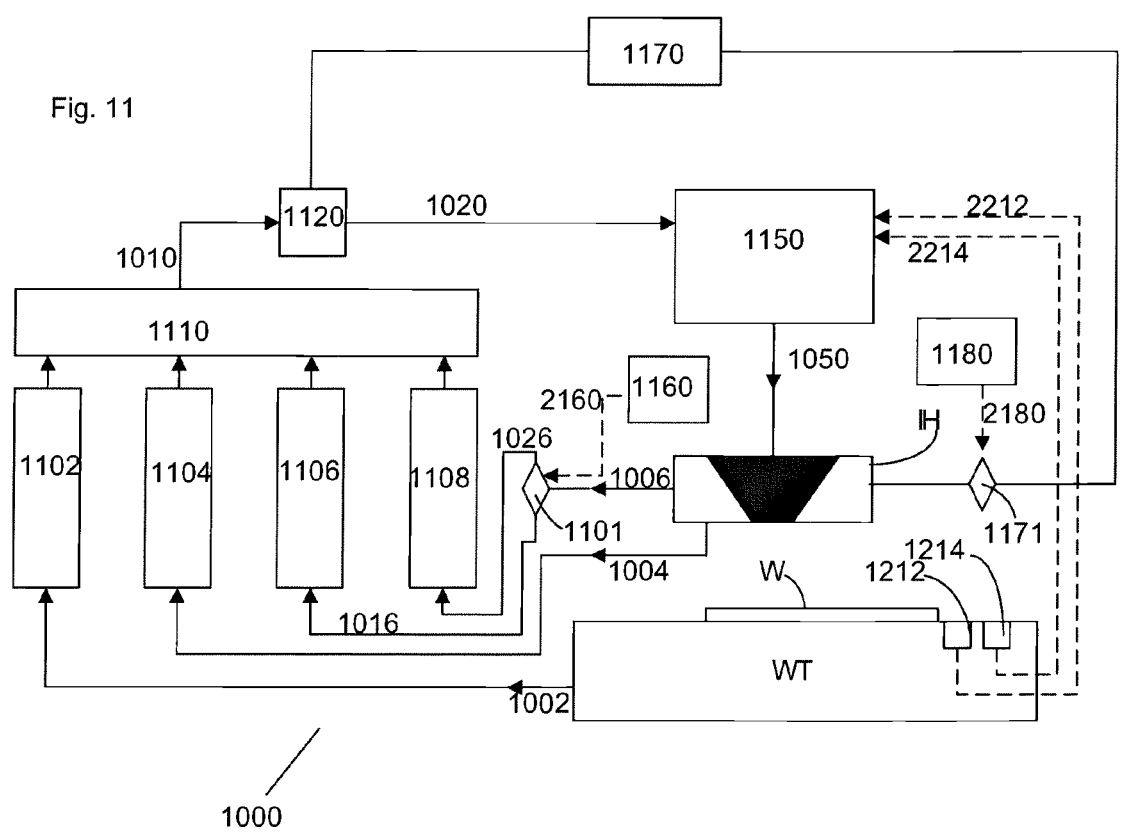
FIG. 11 illustrates schematically a fifth embodiment of the present invention.

A fifth embodiment is illustrated in FIG. 11. The fifth embodiment is the same as the fourth embodiment except as described below.

The fifth embodiment is optimized in order to recycle the immersion liquid which passes through the liquid supply system during idle time of the apparatus. Idle time is when liquid is flowing through the liquid supply system IH but there is no irradiation of a substrate and the substrate is not being scanned under the liquid supply system IH. The system is ready to start imaging and exposing. In this case a signal 2180 is provided by a system controller 1180 to a valve 1171 which directs immersion fluid from the liquid supply system IH to a buffer 1170 and thereby to the container 1120 without passing through the any of the parallel liquid treatment units 1102, 1004, 1106, 1108. In this way unnecessary use of the parallel liquid treatment units is avoided.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A apparatus apparatus, comprising:
   a projection system configured to project a patterned radiation beam onto a target portion of a substrate;
   a liquid supply system configured to provide a liquid to a space between the projection system and a substrate;
   a recycling system configured to collect liquid leaving the liquid supply system and to re-provide the liquid to the liquid supply system, the recycling system comprising a first liquid treatment unit configured to treat the liquid, the liquid being recycled from the liquid supply system through the recycling system back to the liquid supply system through a first recycling path;
   a controller configured to direct liquid from the liquid supply system through a second recycling path during idle time of the lithographic apparatus so that liquid is recycled back to the liquid supply system without passing through the first liquid treatment unit,
   wherein the recycling system includes a second liquid treatment unit arranged in parallel with the first liquid treatment unit, the second liquid treatment unit configured to treat a level or type of contaminant or both in the liquid that is different from a level or type of contaminant or both treated by the first liquid treatment unit.

2. The apparatus of claim 1, wherein the first and the second liquid treatment unit are configured to treat liquid from a different source.

3. An immersion lithographic apparatus configured to project a patterned beam of radiation through a liquid onto a substrate, the apparatus comprising a liquid circuit around which the liquid is configured to flow, the liquid circuit comprising some parts common to all liquid flow and some parts comprising separate liquid flow paths, wherein a first of the separate liquid flow paths includes a first liquid treatment unit configured to treat liquid passing through said first liquid treatment unit and wherein a second of the separate liquid flow paths recycles liquid during idle time of the lithographic apparatus without passing the liquid through the first liquid treatment unit, wherein a third of the separate liquid flow paths includes a second liquid treatment unit configured to treat liquid passing through it, the second liquid treatment unit configured to treat a level or type of contaminant or both in the liquid that is different from a level or type of contaminant or both treated by the first liquid treatment unit.

4. A lithographic apparatus, comprising:
- a projection system configured to project a patterned radiation beam onto a target portion of a substrate;
- a liquid supply system configured to provide a liquid to a space between the projection system and a substrate;
- a recycling system configured to collect liquid leaving the liquid supply system and to re-provide the liquid to the liquid supply system, the recycling system comprising a plurality of parallel liquid treatment units configured to treat the liquid in accordance with how the liquid was removed from the space, in accordance with whether or not the patterned beam of radiation had passed through the liquid, or both, such that there are a plurality of recycling paths for liquid from the liquid supply system through the recycling system back to the liquid supply system;
- a controller configured to direct liquid from the liquid supply system through a another recycling path during idle time of the apparatus so that liquid is recycled back to the liquid supply system without passing through the plurality of parallel liquid treatment units.

5. The apparatus of claim 4, wherein idle time includes a time during which liquid has not been exposed to radiation from the projection system, not been exposed to a top surface of the substrate, or both.

6. The apparatus of claim 4, wherein, during idle time of the lithographic apparatus, liquid is directed to a buffer container via the other recycling path.

7. The apparatus of claim 4, wherein the recycling system includes a first liquid treatment unit configured to treat a level or type of contaminant or both in the liquid that is different from a level or type of contaminant or both treated by a second liquid treatment unit.

* * * * *